United States Patent
Zhao

(10) Patent No.: US 10,204,931 B2
(45) Date of Patent: Feb. 12, 2019

(54) ELECTRICALLY CONDUCTIVE STRUCTURE AND MANUFACTURING METHOD THEREOF, ARRAY SUBSTRATE, DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CH)

(72) Inventor: Na Zhao, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/105,538

(22) PCT Filed: Sep. 23, 2015

(86) PCT No.: PCT/CN2015/090358
§ 371 (c)(1),
(2) Date: Jun. 16, 2016

(87) PCT Pub. No.: WO2016/206203
PCT Pub. Date: Dec. 29, 2016

(65) Prior Publication Data
US 2017/0194361 A1 Jul. 6, 2017

(30) Foreign Application Priority Data
Jun. 26, 2015 (CN) .......................... 2015 1 0368751

(51) Int. Cl.
*H01L 27/12* (2006.01)
*H01L 29/423* (2006.01)
*H01L 29/49* (2006.01)

(52) U.S. Cl.
CPC ...... *H01L 27/1244* (2013.01); *H01L 27/1262* (2013.01); *H01L 27/1288* (2013.01); *H01L 29/42384* (2013.01); *H01L 29/4908* (2013.01)

(58) Field of Classification Search
CPC ............. H01L 27/1244; H01L 27/1262; H01L 27/1288; H01L 29/42384; H01L 29/4908
(Continued)

(56) References Cited

U.S. PATENT DOCUMENTS 5,210,435 A * 5/1993 Roth ................. H01L 21/28114
257/344
6,340,610 B1 * 1/2002 Ahn ................... H01L 29/42384
257/E21.414

(Continued)

FOREIGN PATENT DOCUMENTS

CN 1716092 A 1/2006
CN 101076869 A 11/2007
(Continued)

OTHER PUBLICATIONS

Decision on Rejection in Chinese Application No. 201510368751.3 dated Apr. 21, 2017, with English translation.
(Continued)

*Primary Examiner* — Didarul Mazumder
(74) *Attorney, Agent, or Firm* — Womble Bond Dickinson (US) LLP

(57) ABSTRACT

The present disclosure provides an electrically conductive structure and a manufacturing method thereof, an array substrate, and a display device. The manufacturing method of the electrically conductive structure including: forming
(Continued)

stacked layers of electrically conductive films on a substrate; performing patterning process to the layers of electrically conductive films to form an electrically conductive structure with a preset pattern, an edge of the electrically conductive structure being a step-shaped structure.

7 Claims, 2 Drawing Sheets

(58) Field of Classification Search
USPC ..... 257/72; 438/48, 128, 149, 151, 157, 283
See application file for complete search history.

(56) References Cited

U.S. PATENT DOCUMENTS

| | | | | |
|---|---|---|---|---|
| 2002/0154235 A1* | 10/2002 | Kim | ............. | G01N 23/04 348/311 |
| 2006/0003264 A1 | 1/2006 | Watanabe et al. | | |
| 2015/0331530 A1* | 11/2015 | Kim | ............. | G06F 3/0412 345/174 |

FOREIGN PATENT DOCUMENTS

| | | |
|---|---|---|
| CN | 101771072 A | 7/2010 |
| CN | 102315111 A | 1/2012 |
| CN | 103199060 A | 7/2013 |
| CN | 103199060 A | 7/2013 |
| EP | 1465471 A2 | 10/2004 |
| JP | 2002352627 A | 12/2002 |

OTHER PUBLICATIONS

International Search Report and Written Opinion of the ISA in PCT/CN2015/090358, and English translation. 15 pages.

Office Action in Chinese Application No. 201510368751.3 dated May 19, 2016, and English translation. 12 pages.

Office Action in Chinese Application No. 201510368751.3 dated Nov. 11, 2016, with English translation. 17 pages.

* cited by examiner

US 10,204,931 B2

ELECTRICALLY CONDUCTIVE STRUCTURE AND MANUFACTURING METHOD THEREOF, ARRAY SUBSTRATE, DISPLAY DEVICE

RELATED APPLICATIONS

The present application is the U.S. national phase entry of PCT/CN2015/090358, with an international filing date of Sep. 23, 2015, which claims the benefit of Chinese Patent Application No. 201510368751.3, filed Jun. 26, 2015, the entire disclosures of which are incorporated herein by reference.

TECHNICAL FIELD

The present disclosure relates to a display field, particularly to an electrically conductive structure and a manufacturing method thereof, an array substrate, and a display device.

BACKGROUND OF THE DISCLOSURE

A liquid crystal display panel has replaced a conventional cathode ray tube (CRT) display by right of its advantages of light weight, low power consumption, small radiation, space saving etc, and has been widely applied in various display fields, such as household, public, workplace and personal electronic products.

The existing liquid crystal display panel mainly includes a color film substrate, an array substrate and a liquid crystal layer between the two substrates. At present, a gate line and a gate electrode on the array substrate are generally formed by two layers of metals of Al and Mo. The Al layer is located below, and the Mo layer is located above. However, in the existing array substrate manufacturing process, because etching speeds of an etching solution to the two metals of Mo, Al in a wet etching process are different, the formed signal line boundary will be rendered uneven, and an inverse trapezoid edge structure as shown in FIG. 1 may easily occur. Thus, rupture of a subsequently formed film layer at the edge of the inverse trapezoid structure may be caused easily.

SUMMARY

Therefore, it is desired to reduce the risk of rupture of a film layer formed after a signal line is manufactured in an array substrate manufacturing process.

In one aspect of the present disclosure, a manufacturing method of an electrically conductive structure is provided, comprising: forming stacked layers of electrically conductive films on a substrate; performing patterning process to the layers of electrically conductive films to form an electrically conductive structure with a preset pattern, an edge of the electrically conductive structure being a step-shaped structure.

In some embodiments, after the patterning process, for any two adjacent layers of electrically conductive films in the layers of electrically conductive films, a projection of an electrically conductive film away from the substrate on the substrate is located within a projection of an electrically conductive film close to the substrate on the substrate.

In some embodiments, the layers of electrically conductive films are a first layer of electrically conductive film and a second layer of electrically conductive film arranged on the substrate successively, performing patterning process to the layers of electrically conductive films comprises: forming a photoresist pattern on the second layer of electrically conductive film by a half tone mask exposure process, wherein a middle area of the photoresist pattern comprises photoresist of a first height, an edge area of the photoresist pattern comprises photoresist of a second height, and the first height is larger than the second height; performing first etching to remove the first layer of electrically conductive film and the second layer of electrically conductive film in an area not covered by the photoresist; removing the photoresist of the second height; performing second etching to remove the second layer of electrically conductive film in an area not covered by the photoresist.

In some embodiments, in the second etching, the first layer of electrically conductive film in the area not covered by the photoresist is not etched or is etched partially.

In some embodiments, a material of the first layer of electrically conductive film is aluminum, and a material of the second layer of electrically conductive film is molybdenum.

In some embodiments, after the second etching is performed, a distance between an edge of the first layer of electrically conductive film and an edge of the second layer of electrically conductive film is 0.2 microns~0.4 microns.

In another aspect of the present disclosure, an electrically conductive structure is further provided, comprising stacked electrically conductive layers on a substrate. An edge of the electrically conductive structure is a step-shaped structure.

In some embodiments, for any two adjacent layers of electrically conductive layers, a projection of an electrically conductive layer away from the substrate on the substrate is located within a projection of an electrically conductive layer close to the substrate on the substrate.

In some embodiments, the electrically conductive layers are a first layer of electrically conductive layer and a second layer of electrically conductive layer arranged on the substrate successively, and wherein a material of the first layer of electrically conductive layer is aluminum, and a material of the second layer of electrically conductive layer is molybdenum.

In some embodiments, a thickness of an area of the first layer of electrically conductive layer corresponding to the second layer of electrically conductive layer is equal to or larger than a thickness of other areas of the first layer of electrically conductive layer.

In some embodiments, a distance between an edge of the first layer of electrically conductive layer and an edge of the second layer of electrically conductive layer is 0.2 microns~0.4 microns.

In a further aspect of the present disclosure, an array substrate is further provided, comprising a gate line, a data line, a source electrode, a drain electrode and a gate electrode, wherein at least one of the gate line, the data line, the source electrode, the drain electrode and the gate electrode is the above electrically conductive structure.

In order to solve the above technical problem, in yet another aspect of the present disclosure, a display device is further provided, comprising the above array substrate.

The manufacturing method of an electrically conductive structure provided by the present disclosure, by forming the edge of the electrically conductive structure into a step-shaped structure, mitigates edge gradient of the electrically conductive structure effectively, thereby reducing the risk of rupture of the subsequently formed film layers at the edge of the electrically conductive structure effectively.

DETAILED DESCRIPTION OF THE DISCLOSURE

Next, specific implementing modes of the present disclosure will be described in more detail with reference to drawings and embodiments. The following embodiments are used for illustration of the present disclosure, but not for limitation of the scope of the present disclosure.

Figure 1:
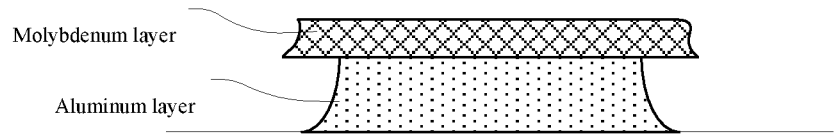
FIG. 1 is a structural schematic view of a signal line on an array substrate in the prior art.
Figure 2:
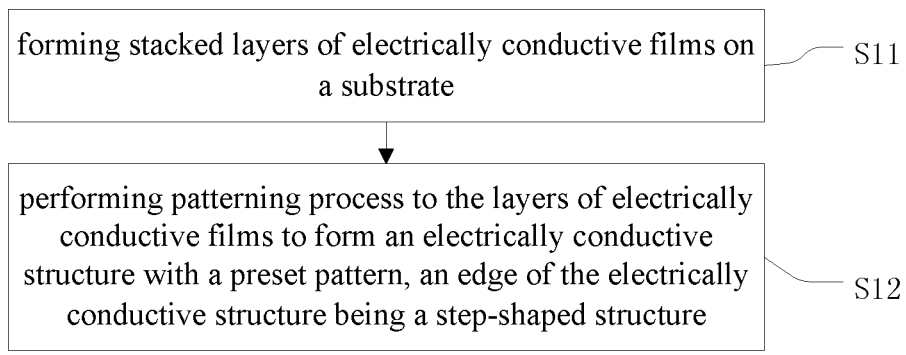
FIG. 2 is a flow chart of a manufacturing method of an electrically conductive structure provided by an embodiment of the present disclosure.

FIG. 2 is a flow chart of a manufacturing method of an electrically conductive structure provided by an embodiment of the present disclosure. The manufacturing method of an electrically conductive structure comprises:

S11: forming stacked layers of electrically conductive films on a substrate;

S12: performing patterning process to the layers of electrically conductive films to form an electrically conductive structure with a preset pattern, an edge of the electrically conductive structure being a step-shaped structure.

The manufacturing method of an electrically conductive structure provided by an embodiment of the present disclosure, by forming the edge of the electrically conductive structure into a step-shaped structure, can mitigate edge gradient of the electrically conductive structure effectively, thereby reducing the risk of rupture of the subsequently formed film layers at the edge of the electrically conductive structure effectively.

In the above manufacturing method of the electrically conductive structure, the electrically conductive films of different layers can be formed using different materials. Each layer of electrically conductive film can be a metal material, and can also be a non-metal material. Because etching speeds of an etching solution to different materials are different in the patterning process, the etching degree to each layer of electrically conductive film in one etching is also different. In order to avoid rupture of the subsequently formed film layer due to the inverse trapezoid edge shape of the electrically conductive structure after being etched, the edge of the electrically conductive structure can be formed into a step-shape structure through several etching processes. For example, after the patterning process, for any two adjacent layers of electrically conductive films in the layers of electrically conductive films, a projection of an electrically conductive film away from the substrate on the substrate is located within a projection of an electrically conductive film close to the substrate on the substrate, thereby forming an electrically conductive structure with an edge in a step shape.

The above manufacturing method of the electrically conductive structure can be used for manufacturing a signal line on an array substrate. For example, it can be used for manufacturing a gate line and a gate electrode on the array substrate. The electrically conductive structure can comprise two layers of electrically conductive layers, which are respectively an aluminum layer and a molybdenum layer. Specifically, the manufacturing method of the electrically conductive structure for example can comprise the following steps.

Figure 3:
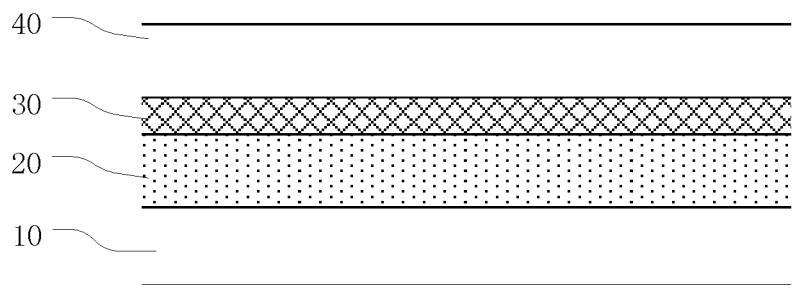
FIG. 3~FIG. 8 are schematic views of manufacturing an electrically conductive structure provided by an embodiment of the present disclosure.

S21: as shown in FIG. 3, forming two stacked layers of electrically conductive films on a substrate 10. A first layer of electrically conductive film 20 can be an aluminum material, and a second layer of electrically conductive film 30 can be a molybdenum material.

S22: forming a layer of photoresist layer 40 on the second layer of electrically conductive film 30. As shown in FIG. 3, the first layer of electrically conductive film 20, the second layer of electrically conductive film 30 and the photoresist layer 40 are arranged on the substrate 10 successively.

Figure 4:
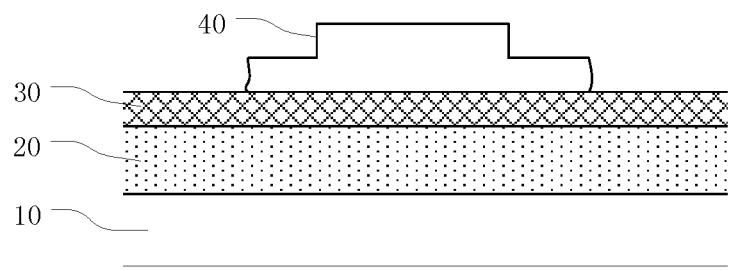

S23: performing exposure to the photoresist layer 40 by a half tone mask exposure process to form a fully exposed area, a partially exposed area and an unexposed area on the photoresist layer 40, then removing the photoresist that has been exposed in the fully exposed area and the partially exposed area, to form a photoresist pattern as shown in FIG. 4. A middle area of the formed photoresist pattern comprises photoresist of a first height (located in the unexposed area), an edge area of the photoresist pattern comprises photoresist of a second height (located in the partially exposed area), and the first height is larger than the second height.

Figure 5:
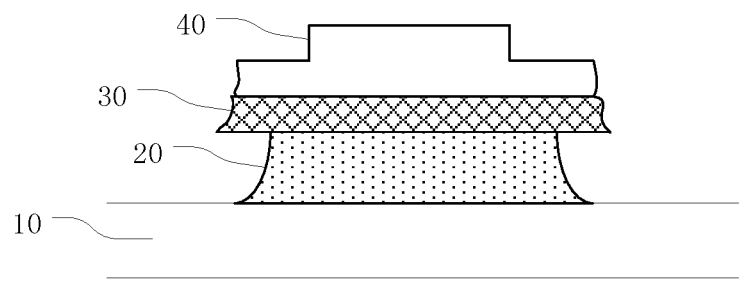

S24: performing first etching to remove the first layer of electrically conductive film and the second layer of electrically conductive film in an area not covered by the photoresist, to obtain the structure as shown in FIG. 5. In this etching, because etching speeds of an etching solution to different materials are different, the etching degree to each layer of electrically conductive film is also different, and the inverse trapezoid edge shape as shown in FIG. 5 may easily occur.

Figure 6:
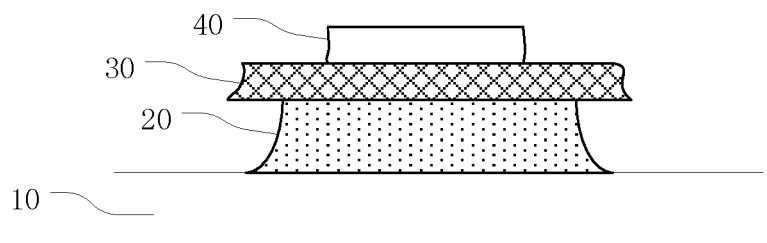

S25: removing the photoresist of the second height. Specifically, the unexposed photoresist in the partially exposed area can be removed through ashing process, as shown in FIG. 6, thereby exposing an edge area of the electrically conductive structure formed in step S24.

Figure 7:
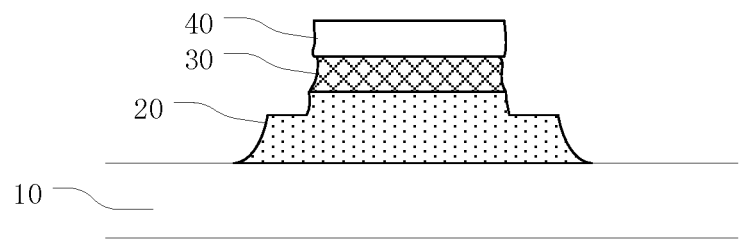

S26: performing second etching to remove the second layer of electrically conductive film located in an edge area of the electrically conductive structure not covered by the photoresist. As shown in FIG. 7, the second layer of electrically conductive film located in the edge area is fully etched, and the first layer of electrically conductive film located in the edge area is not etched or etched partially. The second etching can also use a wet etching process. Specifically the effect of enabling the second layer of electrically conductive film located in the edge area to be fully etched while enabling the first layer of electrically conductive film located in the edge area not to be etched or etched partially can be achieved by controlling etching time. In some embodiments, after the second etching, a distance between an edge of the first layer of electrically conductive film and an edge of the second layer of electrically conductive film can be 0.2 microns~0.4 microns. For example, it can be 0.25 microns, 0.3 microns, or 0.35 microns etc.

Through the above two etchings, not only an electrically conductive structure with the desired pattern can be formed, but also the edge of the electrically conductive structure can be formed into a step-shaped structure since the etching amount of the second layer of electrically conductive film is larger than the etching amount of the first layer of electrically conductive film.

Figure 8:
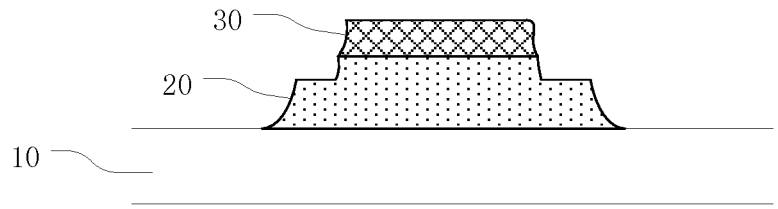

S27: removing the residual photoresist so as to obtain the electrically conductive structure with the step-shaped edge as shown in FIG. 8. The electrically conductive structure in this shape can prevent rupture of the subsequently formed film layer at the edge of the electrically conductive structure.

Embodiments of the present disclosure, by manufacturing the signal line structure on the array substrate using the half tone mask exposure process, enables the edge of the formed signal line to be in a step-shaped structure, thereby mitigating the edge gradient of the electrically conductive structure effectively and reducing the risk of rupture of the subsequently formed film layers at the edge of the electrically conductive structure. Moreover, the present disclosure does not have to control the edge shape of the formed signal line based on a selection ratio of the etching solution anymore, thereby avoiding occurrence of such a defect completely.

An embodiment of the present disclosure further provides a electrically conductive structure, comprising stacked electrically conductive layers on a substrate. An edge of the electrically conductive structure is a step-shaped structure.

For any two adjacent layers of electrically conductive layers, a projection of an electrically conductive layer away from the substrate on the substrate is located within a projection of an electrically conductive layer close to the substrate on the substrate.

The above electrically conductive structure can be a signal line structure on an array substrate. For example, it can be a gate line and a gate structure. The electrically conductive layers comprised in the electrically conductive structure are a first layer of electrically conductive layer and a second layer of electrically conductive layer arranged on the substrate successively. The material of the first layer of electrically conductive layer can be aluminum, and the material of the second layer of electrically conductive layer can be molybdenum. In order to enable the edge of the electrically conductive structure to be a step-shaped structure, a thickness of an area of the first layer of electrically conductive layer corresponding to the second layer of electrically conductive layer can be equal to or larger than a thickness of other areas of the first layer of electrically conductive layer. In some embodiments, a distance between an edge of the first layer of electrically conductive layer and an edge of the second layer of electrically conductive layer is 0.2 microns~0.4 microns. For example, it can be 0.25 microns, 0.3 microns, or 0.35 microns etc.

In addition, the present disclosure further provides an array substrate, comprising a gate line, a data line, a source electrode, a drain electrode and a gate electrode. At least one of the gate line, the data line, the source electrode, the drain electrode and the gate electrode is the above electrically conductive structure.

An embodiment of the present disclosure further provides a display device, comprising the above array substrate. The display device provided by the embodiment of the present disclosure can be any product or component with the display function, such as a laptop display screen, a liquid crystal display, a liquid crystal television, a digital photo frame, a mobile phone, a tablet computer.

The above implementing modes are only used for illustration of the present disclosure, rather than limitation to the present disclosure. The ordinary skilled person in the related technical field, can also make various modifications and variations without departing from the spirit and the scope of the present disclosure. Therefore, all the equivalent technical solutions are also encompassed by the present disclosure. The patent protection scope of the present disclosure should be defined by claims.

The invention claimed is:

1. An electrically conductive structure, comprising stacked electrically conductive layers on a substrate, wherein an edge of the electrically conductive structure is a step-shaped structure,
   wherein the stacked electrically conductive layers are a first layer of electrically conductive layer and a second layer of electrically conductive layer arranged on the substrate successively, and wherein a material of the first layer of electrically conductive layer is aluminum, and a material of the second layer of electrically conductive layer is molybdenum;
   wherein a thickness of vertically aligned portion of the first layer of electrically conductive layer covered by the second layer of electrically conductive layer is larger than a thickness of each of side portions of the first layer of electrically conductive layer.

2. The electrically conductive structure according to claim 1, wherein for any two adjacent layers of the stacked electrically conductive layers, a projection of the second layer of electrically conductive layer away from the substrate on the substrate is located within a projection of the first layer of electrically conductive layer close to the substrate on the substrate.

3. The electrically conductive structure according to claim 1, wherein a distance between an edge of the first layer of electrically conductive layer and an edge of the second layer of electrically conductive layer is 0.2 microns~0.4 microns.

4. An array substrate, comprising a gate line, a data line, a source electrode, a drain electrode and a gate electrode, wherein at least one of the gate line, the data line, the source electrode, the drain electrode and the gate electrode is the stacked electrically conductive structure according to claim 1.

5. A display device, comprising an array substrate according to claim 4.

6. The array substrate according to claim 4, wherein for any two adjacent layers of the stacked electrically conductive layers, a projection of the second layer of electrically conductive layer away from the substrate on the substrate is located within a projection of the first layer of electrically conductive layer close to the substrate on the substrate.

7. The array substrate according to claim 4, wherein a distance between an edge of the first layer of electrically conductive layer and an edge of the second layer of electrically conductive layer is 0.2 microns~0.4 microns.

* * * * *